US011156649B2

(12) United States Patent
Dahms et al.

(10) Patent No.: US 11,156,649 B2
(45) Date of Patent: Oct. 26, 2021

(54) TRANSPORT UNIT HAVING AT LEAST ONE INSTALLATION

(71) Applicant: SIEMENS MOBILITY GMBH, Munich (DE)

(72) Inventors: Frank Dahms, Hoechstadt/Aisch (DE); Michael Dirauf, Bad Staffelstein (DE)

(73) Assignee: Siemens Mobility GmbH, Munich (DE)

( * ) Notice: Subject to any disclaimer, the term of this patent is extended or adjusted under 35 U.S.C. 154(b) by 436 days.

(21) Appl. No.: 16/079,315

(22) PCT Filed: Feb. 8, 2017

(86) PCT No.: PCT/EP2017/052674
§ 371 (c)(1),
(2) Date: Aug. 23, 2018

(87) PCT Pub. No.: WO2017/153111
PCT Pub. Date: Sep. 14, 2017

(65) Prior Publication Data
US 2019/0049503 A1    Feb. 14, 2019

(30) Foreign Application Priority Data

Mar. 7, 2016   (DE) .................. 102016203676.9

(51) Int. Cl.
*G01R 31/00* (2006.01)
*G05B 13/04* (2006.01)

(52) U.S. Cl.
CPC ......... *G01R 31/008* (2013.01); *G01R 31/007* (2013.01); *G05B 13/04* (2013.01)

(58) Field of Classification Search
CPC ..... G01R 31/008; G01R 31/007; G05B 13/04
See application file for complete search history.

(56) References Cited

U.S. PATENT DOCUMENTS 5,214,582 A    5/1993  Gray
5,838,596 A *  11/1998 Shimomura ........... G03G 15/50
                                                     703/6
(Continued)

FOREIGN PATENT DOCUMENTS

CN    102431545 A    5/2012
CN    103064330 A    4/2013
(Continued)

OTHER PUBLICATIONS

Yin, et al., A web-based, collaborative modeling, simulation, and parallel computing environment for electromechanical systems, Advances in Mechanical Engineering, pp. 1-16 2015 (Year: 2015).*

*Primary Examiner* — Regis J Betsch
(74) *Attorney, Agent, or Firm* — Laurence A. Greenberg; Werner H. Stemer; Ralph E. Locher

(57) ABSTRACT

A transport unit, in which a rapid and precise fault localization can be achieved, includes an installation, a simulation device with an interface, through which current status data of the installation can be received, and a computing unit configured determine or acquire simulated status data on the basis of simulation data and the current status data, which are representative for a status of at least a part of the installation. A method for controlling an installation in a transportation unit, in particular a rail vehicle, is also provided.

9 Claims, 2 Drawing Sheets

(56) References Cited

U.S. PATENT DOCUMENTS

| | | | |
|---|---|---|---|
| 7,177,789 B1 | 2/2007 | Miglianico | |
| 8,370,008 B2* | 2/2013 | Yamamoto | B61L 25/026 701/20 |
| 8,577,522 B2 | 11/2013 | Walter et al. | |
| 2011/0077815 A1* | 3/2011 | Walter | G01M 17/00 701/31.4 |
| 2013/0099916 A1 | 4/2013 | Camp et al. | |
| 2015/0276555 A1 | 10/2015 | Bourgoin et al. | |
| 2017/0166226 A1 | 6/2017 | Von Flottwell | |
| 2017/0361856 A1 | 12/2017 | Fischer | |

FOREIGN PATENT DOCUMENTS

| | | |
|---|---|---|
| CN | 104602286 A | 5/2015 |
| CN | 104765681 A | 7/2015 |
| CN | 105365825 A | 3/2016 |
| DE | 60002648 T2 | 3/2004 |
| DE | 102008028264 B3 | 12/2009 |
| DE | 102014214225 A1 | 7/2015 |
| DE | 102014201729 A1 | 8/2015 |
| DE | 102014226910 A1 | 6/2016 |
| RU | 2573536 C1 | 1/2016 |
| WO | 2017113787 A1 | 7/2017 |

* cited by examiner

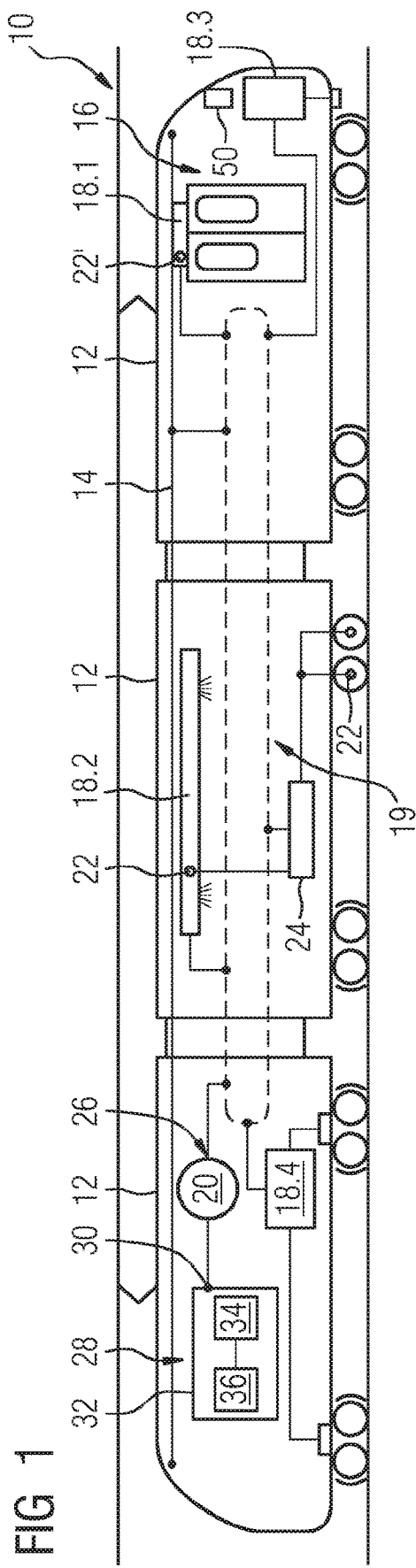
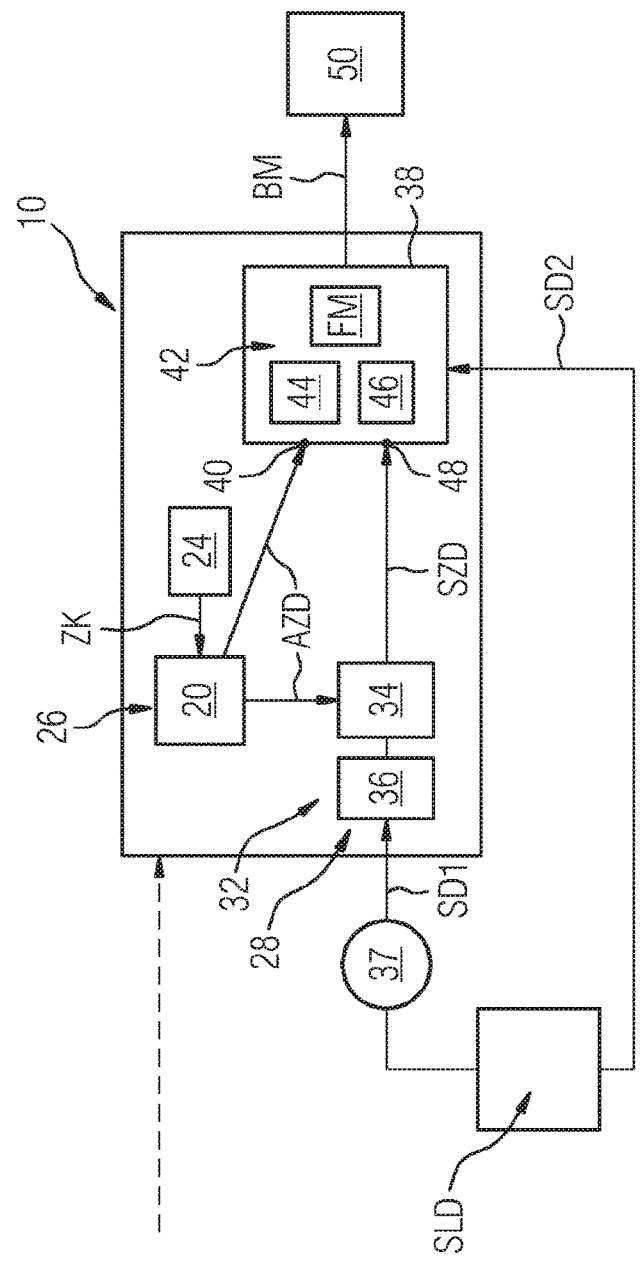

TRANSPORT UNIT HAVING AT LEAST ONE INSTALLATION

BACKGROUND OF THE INVENTION

FIELD OF THE INVENTION

The invention relates to a transportation unit having at least one installation.

In technical installations on board transportation units, in particular rail vehicles, failure of components may occur during operation. To address this problem, fast and as accurate as possible location of errors is necessary in order to correct the error and to minimize the downtime in the installation.

SUMMARY OF THE INVENTION

The invention addresses the problem of providing a transportation unit in which fast and accurate error location can be achieved.

For this purpose, it is proposed that the transportation unit comprises a simulation system having an interface, via which current status data relating to the installation can be received, and having a computing unit that is designed for the purpose of acquiring, on the basis of simulation data and of the current status data, simulated status data that is representative of a status of at least part of the installation. Due such a simulation system being arranged on board the transportation unit, current status data can be quickly transmitted to the simulation system over short transmission paths. Unlike a diagnostic method that is based on a comparison of an actual status of the installation with a static model of the installation, statuses of at least the part of the installation are advantageously simulated dynamically. This is intended to be understood in particular to mean that the simulation system simulates dynamic processes, such as, in particular, the actuation of components, for example, the actuation of a switch that simulates an electrical consumer etc. being switched on or off. In this case, simulated status data that is representative of a status of at least the part of the installation are generated as a result of a dynamic process. In this sense, the simulation system can thus be characterized in that the computing unit thereof is designed to dynamically acquire simulated status data.

The current status data is preferably representative of a virtual status of at least a part of the installation. In this case, it can at least partly be a case of the same part of the installation, the status of which the simulated status data is representative, or a different part, with there preferably being a functional relationship between the two parts.

The transportation unit preferably comprises sensor units that are each designed to acquire at least one status parameter of the installation, the current status data being provided on the basis of status parameters. The status parameters can be transmitted to provide current status data via a control network of the transportation unit, wherein the sensor units are preferably linked up with at least one interface unit that is connected to the control network. Here, the interface unit can be embodied as what is known as an input-output interface (also called an "I/O module"). Examples of status parameters are a temperature parameter, a status parameter that is representative of the status "on/off", "open/closed", for example, a voltage or electric current parameter, and so on. In this context, a monitoring unit, which is designed to monitor the status of a unit assigned thereto, can be understood as being a sensor unit. A status parameter "of the installation" is intended to mean a parameter for the status of at least one component of the installation.

Status parameters can in addition be output by subsystems of the installation via dedicated sub-system interfaces. In particular, the subsystems are each connected to the aforementioned control network via such a dedicated interface. Examples of subsystems in a transportation unit are a door control system, a brake control system, a drive control system, a lighting control system, and so on. Status parameters of a subsystem can be a parameter acquired by a sensor unit of the subsystem, a status report issued by a control unit of the subsystem, and so on.

The current status data can correspond to status parameters or it can be generated on the basis of status parameters.

The simulation data is usefully generated on the basis of information specific to the installation, in particular to the structure, the functions, and the functional relationships between the components thereof. In a particularly advantageous manner, simulation data that is generated during the development and/or during testing procedures of the transportation unit can be used for the simulation system, which acquires simulated status data during normal operation of the transportation unit. The complex generation of a static model that is extremely specific to the transportation unit can be avoided.

In an advantageous embodiment of the invention, the simulation data is based on the at least partly automated, advantageously fully automated, conversion of wiring diagram data relating to the installation. Particularly advantageously, the simulation data can be generated at least partly automatically by means of corresponding software on the basis of circuit diagrams of the installation. This is typically achieved during the development and/or the test phase of a transportation unit, it advantageously being possible to use the results of these production phases of the transportation unit to carry out simulations on board the transportation unit during normal operation thereof.

Particularly advantageously, the simulation system has a memory unit in which at least one simulation program that can be executed by the computing unit is stored, the simulation data being provided as a component of the simulation program. As a result thereof, a particularly rapid generation of simulated status data can be achieved using the simulation data since the computing unit's accessing of simulation data stored outside the simulation program can be reduced, and in particular can be avoided. The simulation data is preferably integrated into the simulation program when the simulation program is compiled. The term "compiling" is to be understood in particular to mean the generation of a program file that can be executed by the computing unit. For example, this file can include the typical ".exe" format.

In an advantageous embodiment of the invention, it is proposed that the transportation unit comprises a data system that is provided for the purpose of making available the current status data, and by means of which device the simulation system can have a data connection via the interface. As a result thereof, a central provision of current status data can be achieved in the transportation unit, as a result of which a simple transmission of the status data for the simulation system can be achieved.

In this context, it is proposed that the transportation unit has a control unit to control the installation, the data system being at least partly a component of the control unit. As a result thereof, a unit that is typically provided with a central functionality in the installation can be used as the data system. In this case, the provision of current status data can be achieved as a result of the fact that the control unit provides a process image of the installation for a data transmission to the simulation system. Such a process image exists, for example, in the case of programmable logic controllers (or "PLCs").

An evaluation of simulated status data can advantageously be achieved for diagnostic purposes since the transportation unit comprises a diagnostic system with a first interface, via which current status data relating to the installation can be received, a second interface via which the simulated status data can be received, and an evaluation unit, which is provided to compare the current status data with the simulated status data.

A particularly advantageous generation of error messages during normal operation of the transportation unit and a safe operation of the installation can be achieved if the simulated status data is representative of a desired status relating to the part of the installation and if the diagnostic system is designed to generate an error report if a deviation from the desired status is detected by the evaluation unit.

In this context, it is proposed that the diagnostic system is designed to take into account structural data that is representative of topological and/or functional relationships of the unit with at least one second unit in the installation in order to generate an error report with respect to a first unit of the installation. As a result thereof, the generation of error reports may be subject to certain rules, with the application of the rule being based on the structural data. For example, structural data relating to the first unit of the installation can be representative of an arrangement of this unit relative to a second unit that is embodied as a voltage source. The structural data can alternatively or additionally be representative of the topological, in particular circuit-related structure, in which the first unit and the second unit are arranged. In particular, the structural data can represent the fact that the first unit and the second unit belong to the same or to a different branch with respect to a further unit that is embodied as a voltage source. At the same time, it is advantageously possible to determine, on the basis of the structural data, whether the first unit and the second unit are in parallel with respect to the voltage source or are connected to each other in series.

In particular, a number of error reports that have been generated can usefully be restricted by a rule-based generation of error reports supported by structural data, by the diagnostic system being designed to assign an error report to at least one first error when a set of errors is detected, and to suppress, on the basis of the structural data, the generation of reports relating to errors which have a causal link with the first error. This makes it possible, in particular, to avoid an undesirable cascade of error reports due to errors that result from the first error. This is advantageous, for example, with a set of errors that are recognized as units that are arranged in series with one another with respect to a voltage source.

In a preferred embodiment of the invention, the structural data and the simulation data are provided on the basis of at least one common data set, in particular of a set of wiring diagram data.

Particularly advantageously, the diagnostic system can have a data connection to the aforementioned data system via the first interface.

The transportation unit can be provided for transporting freight. Alternatively or additionally, it can be provided for transporting people. The transportation unit is preferably embodied as a means of transportation for the public transportation of passengers. The operation of public means of transportation, and particularly of rail vehicles, is nowadays subject to more and more stringent requirements relating to the protection of people (also known as "health and safety" requirements).

The transportation unit can be embodied as a vehicle, aircraft or ship. It is preferably embodied as a rail vehicle. The operation of rail vehicles is subject to increasingly stringent requirements with respect to early detection of defects in order to increase the maintenance efficiency.

The invention allows a rapid and reliable error detection to be carried out. This is based on the assumption that a simulated operation of the installation will run without errors. In particular, simulated status data can quickly form a particularly reliable basis of comparison for error detection.

The invention additionally relates to a method for controlling an installation involving a transportation unit, in particular a rail vehicle.

It is proposed that current status data relating to the installation is provided during operation of the transportation unit, that the current status data is received by a simulation system in the transportation unit, and that the simulation system acquires simulated status data that is representative of a status of at least one part of the installation, on the basis of the current status data and of simulation data. Regarding the advantageous effects of the proposed method, reference is made to the above statements relating to the transportation unit according to the invention.

Where the transportation unit is embodied as a means of transportation for the public transportation of passengers, the method is advantageously carried out during passenger operation of the transportation unit.

BRIEF DESCRIPTION OF THE SEVERAL VIEWS OF THE DRAWING

An exemplary embodiment of the invention is explained on the basis of the drawings, in which:

FIG. 1: shows a rail vehicle with an installation in a schematic side view,

FIG. 2: shows a simulation system and a diagnostic system of the rail vehicle from FIG. 1 and FIG. 3: shows a part of the installation in a real representation and a simulated representation.

DESCRIPTION OF THE INVENTION

Figure 3:
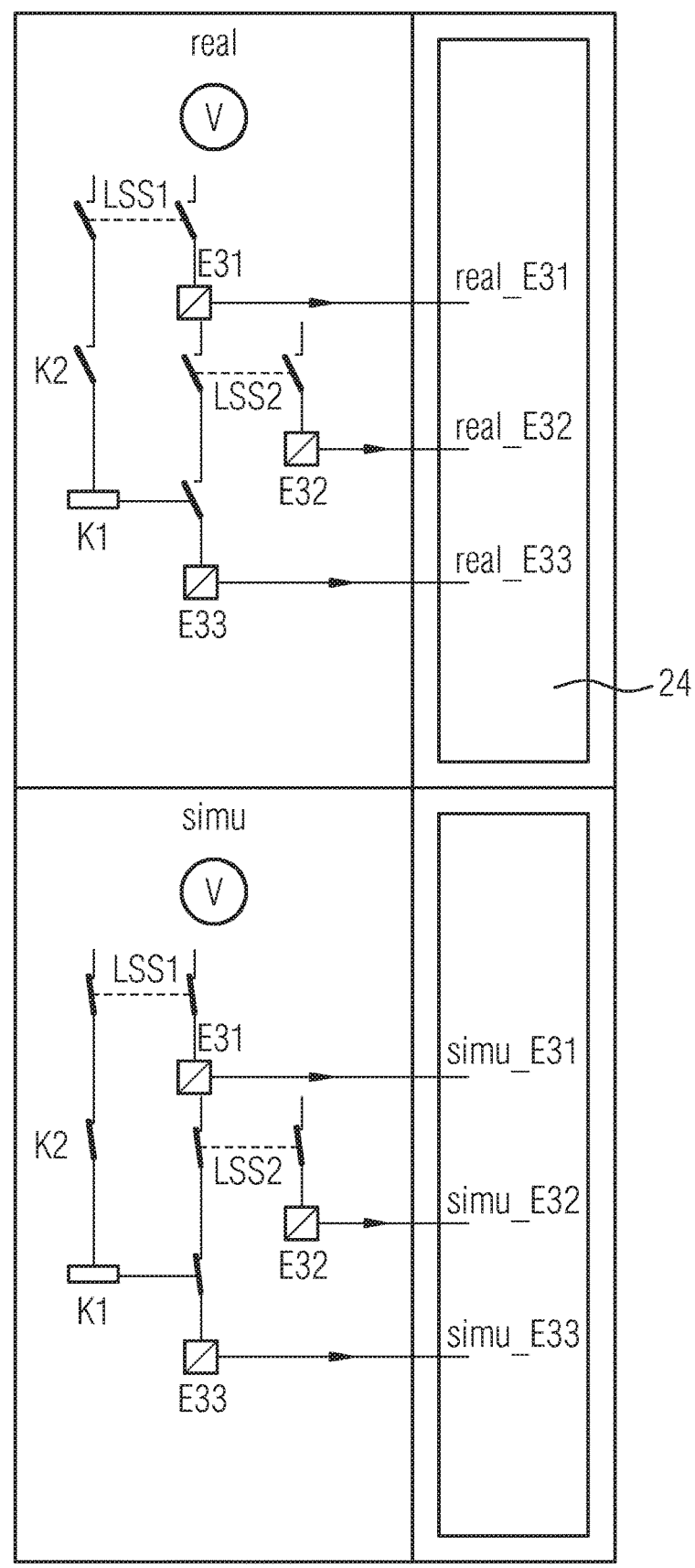

FIG. 1 shows a transportation unit that is embodied as a rail vehicle 10 in a schematic side view. The rail vehicle 10 is embodied as a set of carriages 12 that are used for transporting passengers. The carriages 12 can be embodied as a motorized unit that has at least one drive unit to drive at least one driving shaft (not shown) or as non-motorized carriages. In the embodiment considered here, the rail vehicle 10 forms what is known as a motorized train set with at least one motorized carriage and represents a unit that cannot be split up in normal passenger operation. Alternatively, the rail vehicle can represent a part of such a motorized train set. Here, and in the case of a train network 14 (for example, the network known as the "TCN" or "train communication network" {IEC 61375}), the rail vehicle 10 can form a "consist" that is defined in this network. In a further alternative, not shown, the rail vehicle 10 can be formed of a single carriage (a motorized car or a non-motorized car).

The rail vehicle 10 comprises an installation 16, which is made up of functional units 18.1, 18.2, 18.3, 18.4. Typical functional units of a rail vehicle are a door control system (functional unit 18.1), a lighting system (functional unit 18.2), a train safety system (functional unit 18.3), and a brake control system (functional unit 18.4). In the rail vehicle 10 there are further functional units, which are not shown for the sake of clarity. The functional units 18 may also be referred to in the technical jargon as "subsystems".

The installation 16 further comprises means for supplying electrical consumers in the functional units 18, said means being embodied as elements that can carry an electric voltage or as elements that can be actuated, for example switches, to create or cut off an electrical connection. Examples thereof are shown in FIG. 3. The transportation unit 16 additionally comprises at least one control network 19, shown by a dotted line, to which the functional units 18 and a control unit 20 for controlling an operation of the installation 16 are connected. The control network 19 can be embodied, for example, as a Profinet® ring.

The control network 19 is in addition connected to the train network 14. This allows data communication with further rail vehicles (not shown) that are coupled to the rail vehicle 10. The train network 14 can be embodied as described in the aforementioned as an ETB (or Ethernet train backbone) according to the standard IEC 61375.

The rail vehicle 10 additionally comprises sensor units 22, which are provided to acquire status parameters of the installation 16. The sensor units 22 are connected in particular to the control network 20 (via an interface unit 24, in the form of an I/O module, for example). This interface unit 24 (also referred to as a "decentralized peripheral" module) is embodied as a station, by means of which status parameters acquired by the sensor units 22 that are arranged in a part of the installation 16 can be input and transmitted to the central control unit 20. Furthermore, sensor units 22' are provided, which are components of a specific functional unit 18 or of a specific subsystem (as shown in the figure, of a door control system, for example. This subsystem has a dedicated interface, via which it has a data connection with the control network 19. A status parameter acquired by a sensor unit 22' in a subsystem is transmitted to the control unit 20 via the control network 19 over this dedicated subsystem interface.

The control unit 20 provides the installation 16 with status data based on the status parameters and at the same time has in this respect the function of a data system 26. The control unit 20 can be embodied as a PLC and can provide the status data by making available what is known as a process image of the installation 16.

The rail vehicle 10 additionally comprises a simulation system 28, the design and functionality of which are now explained.

The simulation system 28 has a data connection with the control unit 20. This is achieved via an interface 30, which is embodied as a physical connection unit or as a logical port. The simulation system further comprises a computing unit 32, which comprises at least one processor unit 34, by means of which at least one simulation program can be executed, and a memory unit 36, in which at least the program is stored.

The functionality is explained in more detail with reference to FIG. 2, which shows the rail vehicle 10 in a very schematic view.

The computing unit 32, which is equipped with the simulation program, is designed to acquire, on the basis of simulation data SD1 and current status data AZD, simulated status data SZD that is representative of a status of at least one part of the installation 16. The current status data AZD is provided, as described in the aforementioned, by the control unit 20 functioning as a data system 26. This data is made available on the basis of status parameters ZK that have been input by the control unit 20, and is representative of a current status of the corresponding part of the installation 16, which is assigned, for example, to a specific interface unit 24. The current status data AZD is received by the simulation system 28 via the interface thereof 30 (see FIG. 1).

The acquisition of simulated status data SZD by the computing unit 32 is carried out on the basis of simulation data SD1, which is representative of the part of the installation 16, in which the current status data AZD is received, of another part of the installation 16 and/or of the entire installation 16. In particular, it is characteristic of design features of the part and of conditions, in particular of dependent relationships between components of this part.

The simulation data SD1 is based on the at least partly automated conversion of wiring diagram data SLD relating to the installation 16. For example, this wiring diagram data SLD is representative of circuit paths of electrical signals within the installation 16. The generation of the simulation data SD1 can be achieved in the rail vehicle 10 during the operation of the rail vehicle 10 and/or in a ground-based system. It is preferable, however, for the simulation data SD1 to be generated during a development phase of the rail vehicle 10 and to be stored in a memory unit, in particular the memory unit 36. For this purpose, simulation data that is already generated during a test phase of a control software to control operation of the system 16 can be used.

The simulation data SD1 is at least partly contained in the simulation program, by means of the simulation data SD1 being incorporated when said program is compiled—that is, when generating a file that can be executed by the processor unit 34. The simulation program that can be executed by the processor unit 34 is compiled in the development of or in a test phase of the rail vehicle 10 on the basis of the wiring diagram data SLD by means of a compiler 37 and therefore contains the simulation data SD1.

Alternatively or additionally, the SD1 simulation data can be retrieved from the memory unit 36 by the simulation program during the execution of the program.

The simulation data SD1 is based on a virtual representation of at least the corresponding part of the system 16. During the execution of the simulation program, the computing unit 32 can effect dynamic changes in said virtual representation, by for example, a switch in the installation 16 being actuated in the virtual representation. Such virtual actuation procedures be achieved in particular on the basis of the current status data AZD. If a status parameter ZK that has been acquired is representative of the fact that a particular cable carries voltage, for example, a switch that is reached by this voltage is actuated in the virtual representation of the corresponding part of the installation 16 that resulted from the simulation data SD1. This optionally brings about a change in the virtual status of the part of the system 16 that is being considered, the simulated status data SZD that has been acquired being representative of said virtual status.

The rail vehicle further comprises a diagnostic system 38, the design and functionality of which are now described.

The diagnostic system 38 has a data connection with the control unit 20 in its function as a data system 26. This is achieved via a first interface 40, which is embodied as a physical connection unit or as a logical port. The diagnostic system 38 further comprises an evaluation unit 42, which comprises at least one processor unit 44, by means of which at least one diagnostic program can be executed, and a memory unit 46, in which at least the program is stored. The diagnostic system 38 additionally comprises a second interface 48, by means of which it has a data connection with the simulation system 28. Via this second interface 48, it can receive simulated status data SZD from the simulation system 28. The evaluation unit 42 that is equipped with the diagnostic program is designed to compare the current status data AZD with the simulated status data SZD.

The simulated status data SZD is representative of a desired status of the part of the installation 16 that is considered here. The diagnostic system 38 is designed to generate an error report when a deviation of the actual status of the part of the installation 16 that is represented by current status data AZD from the desired status is detected by the evaluation unit 42. This deviation is determined by comparing the simulated status data SZD with current status data AZD. The generation of the error report can be achieved on the basis of the consideration of a threshold value for a deviation between the actual status of the part of the installation 16 that is represented by current status data AZD and the desired status.

A further set of structural data SD2 that differs from the simulation data SD1 that was used in the simulation system 28 can be consulted by the diagnostic system 38. This consists of additional information that provides in particular information about the position of components of the installation 16 relative to one another and relative to a specific voltage source output. This information is referred to in particular as "structural information". It is provided from the circuit diagram data SLD, such that the structural data SD2 and the simulation data SD1 are provided on the basis of a common data set.

On the basis of the structural data SD2, various attributes are calculated, for example for a specific measurement point in the installation 16, such as, for example, the type and position of the feed voltage source, a sequence of components in a series circuit, a current profile in a parallel circuit, and a relationship between components ahead of the measurement point that is considered.

The diagnostic program run by the evaluation unit 42 carries out an evaluation of the simulated status data SZD, of the current status data AZD, and of the structural data SD2 according to the following rules:
- a deviation between the current (actual) and simulated (desired) status of the part of the installation 16 that is being considered results in an error;
- an error that occurs nearer to the relevant voltage source suppresses the generation of an error report for one or a plurality of errors occurring after it;
- an error that occurs ahead of a node suppresses the generation of an error report for one or a plurality of errors that occur in series circuits that are arranged downstream and/or in subordinate nodes.

An error report FM that is not suppressed according to the rules can be provided in the form of a workshop report or an operational report BM for display to the vehicle driver.

In a configuration with a plurality of transportation units coupled to one another, the aforementioned generation of simulated status data and evaluation thereof on the basis of current status data are achieved for the respective installation 16 of the various transportation units. Here, the control unit of a specific transportation unit in the set of transportation units (in the figure, the control unit 20) can receive the results data from the respective evaluation of the further transportation unit or transportation units. This is shown in the figure by means of a dotted arrow and is achieved via the train network 14. From the results data for the entirety of transportation units, diagnostic data sets relating to the entire set of transportation units are generated. Said diagnostic data sets can, for example, be displayed to personnel, such as a driver and/or attendant accompanying the transportation set as operational reports BM via a display unit 50. Typically, the display unit 50 is arranged in a driver's compartment (see FIG. 1).

A concrete example is now explained with reference to FIG. 3. This shows a part of the installation 16 of the rail vehicle 10 according to the current status ("real", upper image) and to a status that is simulated on the basis of acquired simulated status data SZD ("simu", lower image). The measurement point being considered represents a contactor K1 that can be actuated by an electric current signal. This signal originates from a voltage source V and can be guided by means of a circuit breaker LSS1 and a contact K2 to the contactor K1. When the circuit breaker LSS1 is closed, the contactor K1 can be turned on and off by actuating the contact K2.

The contactor K1 is monitored by an auxiliary contact E33. This contact can be considered to be a sensor unit 22 in the sense used in the general description in the aforementioned. The position of the auxiliary contact E33 is input by an interface unit 24, which is embodied as an I/O module.

If the contactor K1 fails, then the auxiliary contact E33 gives notification of an error through the position of said contact. The signal "real_E33" that has been input by the interface unit 24 is equivalent, for example, to the value "0". In the simulation, the contactor K1 is actuated and the auxiliary contact E33 closes. This is achieved on the basis of simulation data that is contained in the simulation program and of current status data, in particular via the active voltage source V and the closed circuit breaker LSS1.

The signal "simu_e33" that was input by the sensor unit 22 as simulated status data in the virtual representation of the installation 16 is equivalent to the value "1".

The evaluation unit 42 compares the two statuses, in particular the signal "real_E33" as current status data and the signal "simu_E33" as simulated status data and reports an error in the signal "real_E33".

It is now assumed that a circuit breaker LSS2, which supplies the auxiliary contact E33 with voltage, opens and the voltage supply is interrupted. An auxiliary contact E32, which monitors the circuit breaker, emits a corresponding signal "real_E32" to the interface unit 24, which signal has the value "0".

In the simulated installation, the circuit breaker LSS2 remains in the closed position, such that the signal "simu_E32" acquires the value "1". The evaluation unit 42 compares the two statuses and reports an error for the signal "real_E32".

If, in this error position of the circuit breaker LSS2, the contactor K1 is switched on, the auxiliary contact_E33 cannot emit a signal due to the absence of electrical voltage, such that the signal "real_E33" has the value "0". In the simulated installation, when the contactor K1 is closed, the auxiliary contact_E33 sends the signal "simu_E33" with the value "1". This could also lead to notification of an error by the evaluation unit 42. According to the rules described in the aforementioned, an error report relating to the signal "real_E33" is suppressed due to the error in the signal "real_E32" since it relates to a component (auxiliary contact_E32) that is arranged nearer to the voltage source V.

The circuit breaker LSS1 is itself monitored by an auxiliary contact E31. If the circuit breaker LSS1 opens in error, this can then be reported as an error by the evaluation unit 42 by comparing the corresponding signals "real_E31" and "simu_e31". The circuit breakers LSS1 and LLS2 belong to parallel branch circuits, which are supplied from a common voltage source V. According to the rules described in the aforementioned, the suppression of an error message to the circuit breaker LSS2 (via the auxiliary contact E32) does not occur due to the error in the circuit breaker LSS1, since these belong to different parallel branches.

An error relating to an isolation contactor, by means of which both branches LSS1 and LSS2 of the voltage source V are supplied, that is, a circuit breaker that is arranged ahead of a branch node of the branches LSS1 and LSS2, would, however, suppress the error messages relating to the circuit breaker LSS1, the contactor K1 and the circuit breaker LSS2, and in principle relating to all the errors in both branches LSS1 and LSS2.

The rules are described here are applied on the basis of the structural data SD2, which contains information about the relative arrangement of the aforementioned components to one another and to the voltage assembly V.

The invention claimed is:

1. A transportation unit being a rail vehicle, comprising:
at least one installation;
a simulation system having an interface for receiving current status data relating to said installation;
a computing unit configured to determine simulated status data being representative of a status of at least one part of said installation, based on simulation data and the current status data;
said simulation system including a memory unit storing at least one simulation program to be executed by said computing unit, and the simulation data being provided as a component of said simulation program, and the simulated status data being representative of a desired status of said at least one part of said installation;
a diagnostic system including a first interface for receiving the current status data relating to said installation, a second interface for receiving the simulated status data, and an evaluation unit configured to compare the current status data with the simulated status data;
said diagnostic system configured to generate an error message when a deviation from the desired status is detected by said evaluation unit;
said diagnostic system configured to generate an error message in said installation with respect to a first unit by taking into account structural data being representative of at least one of topological or functional interrelationships of the first unit with at least one second unit in said installation; and
said diagnostic system configured, upon detecting a set of errors, to assign the error message to at least one first error and, based on the structural data, to suppress a generation of reports regarding errors having a causal link with the first error.

2. The transportation unit according to claim 1, which further comprises sensor units each being configured to acquire at least one status parameter relating to said installation, the current status data being provided on a basis of the at least one status parameter.

3. The transportation unit according to claim 1, wherein the simulation data is based on an at least partly automated conversion of wiring diagram data relating to said installation.

4. The transportation unit according to claim 1, which further comprises a data system configured to make the current status data available, said interface providing a data connection between said simulation system and said data system.

5. The transportation unit according to claim 4, which further comprises a control unit for controlling said installation, said data system being at least partly a component of said control unit.

6. The transportation unit according to claim 1, wherein the structural data and the simulation data are based on at least one common dataset.

7. The transportation unit according to claim 1, which further comprises:
a data system configured to make the current status data available;
said interface providing a data connection between said simulation system and said data system; and
said first interface providing a data connection between said diagnostic system and said data system.

8. The transportation unit according to claim 1, wherein the transportation unit is a transport for a public transportation of passengers.

9. A method for controlling an installation in a transportation unit being a rail vehicle, the method comprising the following steps:
providing the transportation unit according to claim 1;
during operation of the transportation unit:
providing the current status data relating to the installation;
receiving the current status data at the simulation system in the transportation unit, the simulation system including the memory unit storing the at least one simulation program to be executed by the computing unit; and
using the simulation system to determine the simulated status data being representative of the status of at least the part of the installation based on the current status data and simulation data provided as the component of the simulation program.

* * * * *